(12) United States Patent
Yoshida et al.

(10) Patent No.: US 6,495,927 B2
(45) Date of Patent: Dec. 17, 2002

(54) RESIN-MOLDED UNIT INCLUDING AN ELECTRONIC CIRCUIT COMPONENT

(75) Inventors: Shigeyoshi Yoshida, Abiko (JP); Hiroshi Ono, Yokohama (JP)

(73) Assignee: NEC Tokin Corporation, Miyagi (JP)

( * ) Notice: Subject to any disclaimer, the term of this patent is extended or adjusted under 35 U.S.C. 154(b) by 0 days.

(21) Appl. No.: 09/825,420

(22) Filed: Apr. 3, 2001

(65) Prior Publication Data

US 2001/0035579 A1 Nov. 1, 2001

(30) Foreign Application Priority Data

Apr. 4, 2000 (JP) .................................. 2000-102378

(51) Int. Cl.$^7$ .................. H01L 31/11; H01L 23/38
(52) U.S. Cl. .................. 257/787; 257/790; 257/593
(58) Field of Search ......................... 257/787, 790, 257/660, 659, 662, 663, 678, 593

(56) References Cited

U.S. PATENT DOCUMENTS 5,370,766 A  * 12/1994  Desaigouder et al. ........ 156/643

FOREIGN PATENT DOCUMENTS

JP            3-23654    * 1/1991 .................. 257/789

* cited by examiner

*Primary Examiner*—Jasmine J B Clark
(74) *Attorney, Agent, or Firm*—Bradley N. Ruben, PC

(57) ABSTRACT

A resin-molded unit (1) includes a semiconductor bear chip (2) arranged inside and sealed in an epoxy resin mold (3). The resin-molded unit is entirely covered with a magnetic loss film (5) as a high-frequency current suppressor. It is preferable that the magnetic loss film is made of a granular magnetic material. A plurality of lead frames (4) may be extended from the semiconductor bear chip to the outside through the epoxy resin mold.

9 Claims, 6 Drawing Sheets

Frequency (MHz)

RESIN-MOLDED UNIT INCLUDING AN ELECTRONIC CIRCUIT COMPONENT

BACKGROUND OF THE INVENTION

This invention relates to a resin-molded unit comprising an electronic circuit component, such as a semiconductor chip, sealed in a resin mold. In the present specification, the term "resin-molded unit" is used in a broad sense including a resin case and a resin housing also.

In recent years, highly integrated semiconductor devices operable at a high speed are remarkably wide spread and more and more increasingly used. As active devices using the semiconductor devices, there are known a random access memory (RAM), a read only memory (ROM), a microprocessor (MPU), a central processing unit (CPU), an image processor arithmetic logic unit (IPALU), and so on. The above-mentioned active devices are improved every minute so that an operation speed and/or a signal processing speed is rapidly increased. Under the circumstances, an electric signal propagated at a high speed is accompanied with drastic changes in electric voltage or electric current. Such changes constitute a main factor in generation of a high-frequency noise.

On the other hand, the reduction in weight, thickness, and size of electronic components or electronic apparatuses is endlessly making a rapid progress. This results in a remarkable increase in degree of integration of the semiconductor devices and in density of mounting the electronic components to a printed wiring board. In this event, electronic devices and signal lines densely integrated or mounted are very close to one another. Such high-density arrangement, in combination with the increase in signal processing speed mentioned above, will cause the high-frequency noise to be readily induced.

As one example of the electronic components or the electronic apparatuses, there is known a resin-molded unit comprising an electronic circuit component, such as a semiconductor chip, sealed in a resin mold. It is pointed out that such resin-molded unit has a problem of undesired radiation produced from a power supply line. In order to avoid the problem, various countermeasures have been taken. For example, a lumped constant component such as a decoupling capacitor is inserted into the power supply line.

However, in the resin-molded unit including the electronic circuit component operable at a high speed, the noise generated as mentioned above will contain a harmonic component. In this event, a signal path exhibits the behavior as a distributed constant circuit. Therefore, the conventional technique of preventing the noise is not effective because such technique assumes a lumped constant circuit.

SUMMARY OF THE INVENTION

It is therefore an object of this invention to provide a resin-molded unit capable of effectively reducing undesired radiation produced from an electronic circuit component operable at a high speed.

Other objects of the present invention will become clear as the description proceeds.

According to an aspect of the present invention, there is provided a resin-molded unit comprising an electronic circuit component, a resin molding the electronic circuit component therein, and a high-frequency current suppressor covering at least one part of the resin, the high-frequency current suppressor being made of a magnetic loss film.

According to another aspect of the present invention, there is provided a resin-molded unit comprising an electronic circuit component, a resin molding the electronic circuit component therein, and a high-frequency current suppressor covering at least one part of the resin, the high-frequency current suppressor being made of a magnetic loss film which serves to attenuate a high-frequency current flowing through the electronic circuit component and having a frequency within a frequency band between several tens MHz and several GHz.

According to still another aspect of the present invention, there is provided a resin-molded unit comprising an electronic circuit component, a resin molding the electronic circuit component therein, and a high-frequency current suppressor covering at least one part of the resin, the high-frequency current suppressor being made of a magnetic loss film which is made of a magnetic substance of a magnetic composition comprising M, X and Y, where M is a metallic magnetic material consisting of Fe, Co, and/or Ni, X being element or elements other than M and Y, and Y being F, N, and/or O, the M-X-Y magnetic composition having a concentration of M in the composition so that the M-X-Y magnetic composition has a saturation magnetization of 35–80% of that of the metallic bulk of magnetic material comprising M alone, the magnetic composition having the maximum value $\mu''_{max}$ of an imaginary part $\mu''$ of relative permeability in a frequency range of 0.1–10 gigahertz (GHz).

DESCRIPTION OF THE PREFERRED EMBODIMENT

Figure 1:
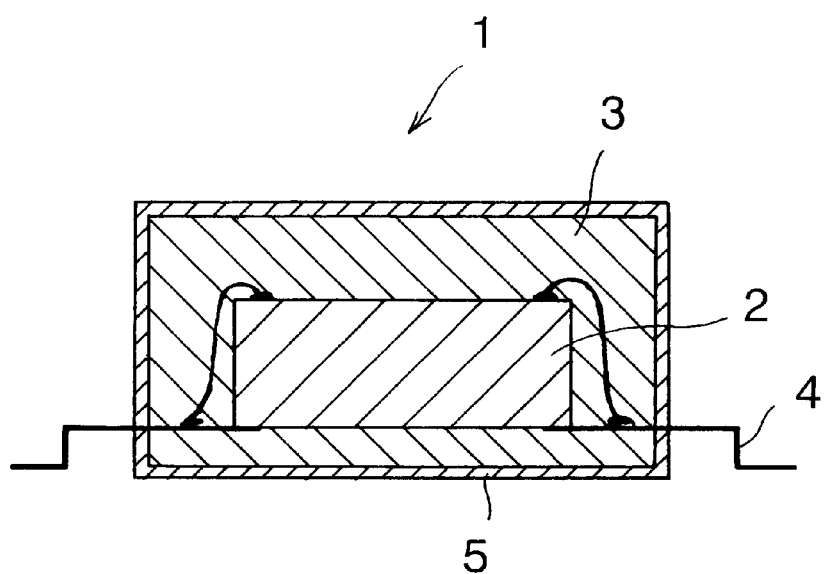
FIG. 1 is a schematic sectional view of a resin-molded unit according to one embodiment of this invention.

Referring to FIG. 1, description will be made of a resin-molded unit according to one embodiment of this invention.

The resin-molded unit is depicted by a reference numeral 1 and contains a semiconductor bear chip 2 arranged inside and sealed in an epoxy resin mold 3. From the semiconductor bear chip 2, a plurality of lead frames 4 are extracted through the epoxy resin mold 3 to the outside.

Furthermore, the epoxy resin mold 3 is entirely covered with a high-frequency current suppressor 5. The high-frequency current suppressor 5 is a thin film magnetic substance formed in the form of a film by sputtering or vapor deposition known in the art, having a thickness between 0.3 $\mu$m and 20 $\mu$m, and exhibiting the conductivity in a frequency band lower than several tens MHz. The high-frequency current suppressor 5 serves to attenuate a high-frequency current flowing through a circuit portion inside the epoxy resin mold 3 and having a frequency within a frequency band between several tens MHz and several GHz.

Upon forming the high-frequency current suppressor 5, use may be made of chemical vapor deposition (CVD), ion beam deposition, gas deposition, and pattern transfer in addition to the sputtering or the vapor deposition mentioned above.

As a material for each of the high-frequency current suppressors 4a, 4b, and 5, use may be made of a narrow-band magnetic loss material which has an M-X-Y composition as a mixture of components or elements M (M being at least one of Fe, Co, and Ni), Y (Y being at least one of F, N, and O), and X (X being at least one element other than those contained in M and Y) and which has a permeability characteristic, given as a relationship between a frequency and an imaginary part $\mu''$ with respect to a real part $\mu'$ of relative permeability, such that the maximum value $\mu''_{max}$ of the imaginary part $\mu''$ (which may be called a magnetic loss term) is present within a frequency range between 100 MHz and 10 GHz and that a relative bandwidth bwr is not greater than 200% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. It is assumed here that the narrow-band magnetic loss material has saturation magnetization between 80% and 60% of that of a metal magnetic material comprising the component M alone and a d.c. electric resistance between 100 $\mu\Omega\cdot$cm and 700 $\mu\Omega\cdot$cm.

As the material for each of the high-frequency current suppressors 4a, 4b, and 5, use may also be made of a wide-band magnetic loss material which has an M-X-Y composition as a mixture of components M (M being at least one of Fe, Co, and Ni), Y (Y being at least one of F, N, and O), and X (X being at least one element other than those contained in M and Y) and which has a permeability characteristic, given as a relationship between a frequency and an imaginary part $\mu''$ with respect to a real part $\mu'$ of relative permeability, such that the maximum value $\mu''_{max}$ of the imaginary part $\mu''$ is present within a frequency range between 100 MHz and 10 GHz and that a relative bandwidth bwr is not smaller than 150% where the relative bandwidth bwr is obtained by extracting a frequency bandwidth between two frequencies at which the value of $\mu''$ is 50% of the maximum $\mu''_{max}$ and normalizing the frequency bandwidth at the center frequency thereof. It is assumed here that the wide-band magnetic loss material has saturation magnetization between 60% and 35% of that of a metal magnetic material comprising the component M alone and a d.c. electric resistance greater than 500 $\mu\Omega\cdot$cm.

In each of the narrow-band magnetic loss material and the wide-band magnetic loss material used as the high-frequency current suppressors 4a, 4b, and 5, the component X is at least one of C, B, Si, Al, Mg, Ti, Zn, Hf, Sr, Nb, Ta, and rare earth elements. The component M is present in a granular structure where particles or grains of the component M are dispersed in a matrix of a compound of the components X and Y The particles have an average particle size between 1 nm and 40 nm. The narrow-band or the wide-band magnetic loss material has an anisotropic magnetic field of 47400 A/m or less. Preferably, the M-X-Y composition of the wide-band or the narrow-band magnetic loss material is an Fe—Al—O composition or an Fe—Si—O composition.

The resin-molded unit 1 is similar in appearance to that of the conventional product but is superior in effect. Specifically, even in occurrence of a harmonic current as an undesired harmonic having a frequency ranging from several tens MHz to several GHz, such high-frequency can be sufficiently attenuated by the high-frequency current suppressor 5. As a result, production of a high-frequency noise can be prevented so as to remove an adverse affect by the high-frequency noise.

As the high-frequency current suppressor 5, use is made of a thin-film magnetic substance which is small in volume and therefore requires less space and which is a magnetic loss material having a large imaginary part (i.e., a "magnetic loss term") $\mu''$ of relative permeability so as to provide effective protection against undesired radiation. As a magnetic substance which shows large magnetic loss, a granular magnetic material is known. Specifically, in case where the concentration of magnetic metal particles in the granular magnetic material falls within a particular range, excellent magnetic loss characteristic can be obtained in a high-frequency region.

Next, description will be made as to granular structure and production methods of M-X-Y magnetic composition.

Figure 2:
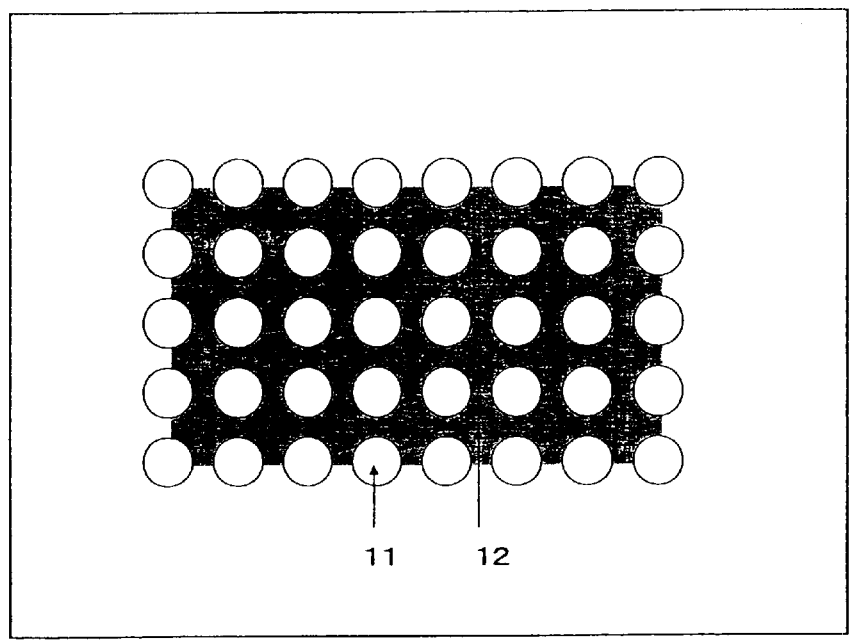
FIG. 2 is a schematic view showing a granular structure of M-X-Y magnetic composition.

Referring to FIG. 2 in which schematically shows the granular structure of M-X-Y magnetic composition, particles 11 of metallic magnetic material M are uniformly or evenly distributed in a matrix 12 consisting of X and Y.

Figure 3A:
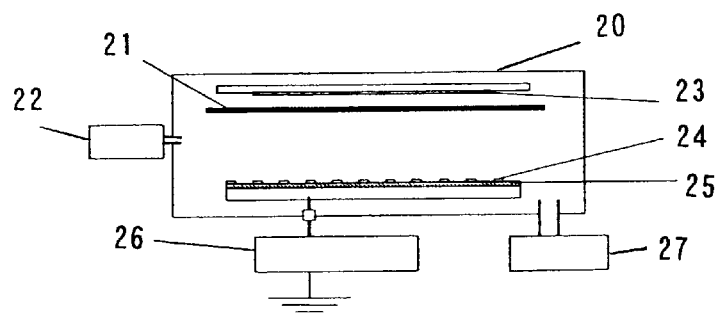
FIG. 3A is a schematic sectional view showing a structure of a sputtering apparatus which was used in examples.

Referring to FIG. 3A, a sputtering apparatus shown therein was used for producing samples in the following examples and comparative examples. The sputtering apparatus has a conventional structure and comprises a vacuum container 20, a shutter 21, an atmospheric gas source 22, a substrate or a glass plate 23, chips 24 (X or X-Y), a target 25 (M), an RF power source, and a vacuum pump 27. The atmospheric gas source 22 and the vacuum pump 27 are connected to the vacuum container 20. The substrate 23 confronts to the target 25 on which chips 24 are disposed. The shutter 21 is disposed in front of the substrate 21. The RF power source 26 is connected to the target 25.

Figure 3B:
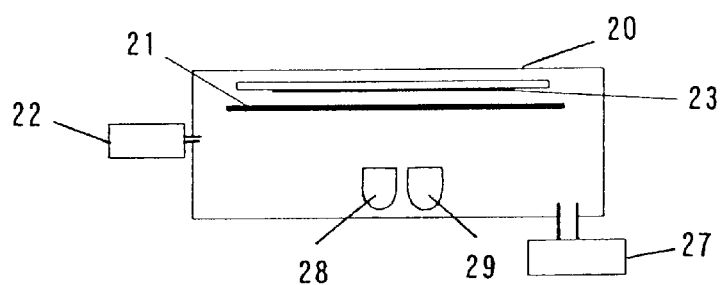
FIG. 3B is a schematic sectional view showing a structure of a vapor deposition apparatus which was used in examples.

Referring to FIG. 3B, a vapor deposition apparatus shown therein was also used another apparatus for producing samples in the following examples and comparative examples. The vapor deposition apparatus has a conventional structure and has vacuum container 20, atmospheric gas source 22, and vacuum pump 27 similar to the sputtering apparatus but has a crucible 28 including materials (X-Y) in place of chips 24, target 25 and RF power source 26.

EXAMPLE 1

A thin film of M-X-Y magnetic composition was made on a glass plate by use of the sputtering apparatus shown in FIG. 3A at a sputtering condition shown in Table 1.

TABLE 1

| | |
|---|---|
| Vacuum degree before sputtering | <1 × 10⁻⁶ Torr |
| Atmosphere | Ar gas |
| Electric Power | RF |
| Targets | Fe (diameter of 100 mm) and Al₂O₃ chip (120 pieces) (chip size: 5 mm × 5 mm × 2 mm) |

The film sample 1 produced was analyzed by a fluorescent X-ray spectroscopy and confirmed as a film of a composition $Fe_{72}Al_{11}O_{17}$. The film sample 1 had 2.0 micrometer ($\mu m$) in thickness, 530 micro ohm centimeters ($\mu\Omega\cdot cm$) in DC specific resistance, 18 Oe in anisotropy field (Hk), and 16,800 Gauss in saturation magnetization (Ms).

A percent ratio of the saturation magnetization of the film sample 1 and that of the metallic material M itself {Ms(M-X-Y)/Ms(M)}×100 was 72.2%.

Figure 4:
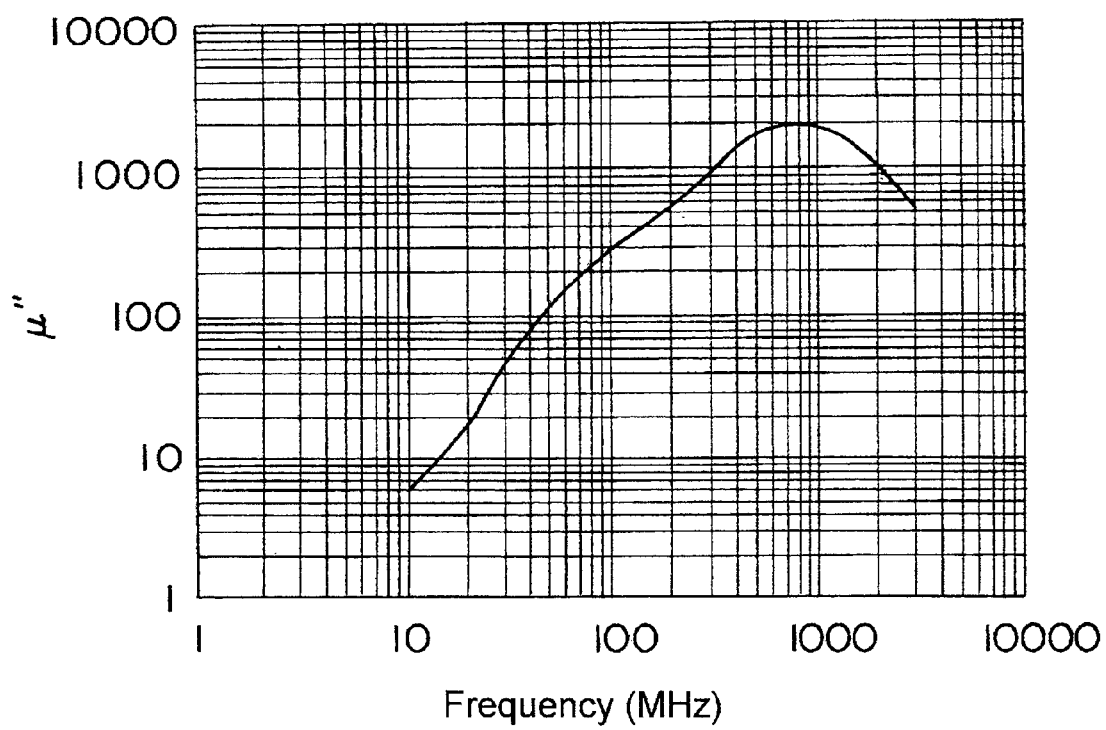
FIG. 4 is a graphical view showing a permeability frequency response of film sample 1 in Example 1.

In order to measure a permeability frequency response, the film sample 1 was formed in a ribbon like form and inserted in a coil. Under application of a bias magnetic field, an impedance variation of the coil was measured in response to frequency change of AC current applied to the coil. The measurement was several times for different values of the bias magnetic field. From the measured impedance variation in response to frequency variation, the permeability frequency response ($\mu''$-f response) was calculated and is shown in FIG. 4. It will be noted from FIG. 4 that the imaginary part of relative permeability has a high peak or the maximum value ($\mu''_{max}$) and rapidly falls either side of the peak. The natural resonance frequency (f($\mu''_{max}$)) showing the maximum value ($\mu''_{max}$) is about 700 MHz. From the $\mu''$-f response, a relative bandwidth bwr was determined as a percentage ratio of bandwidth between two frequency points which shows the imaginary part of relative permeability as a half value $\mu''_{50}$ of the maximum value $\mu''_{max}$, to center frequency of said bandwidth. The relative bandwidth bwr was 148%.

EXAMPLE 2

In a condition similar to that in Example 1 but using of 150 Al₂O₃ chips, a film sample 2 was formed on a glass plate.

The film sample 2 produced was analyzed by a fluorescent X-ray spectroscopy and confirmed as a film of a composition $Fe_{44}Al_{22}O_{34}$. The film sample 2 had 1.2 micrometer ($\mu m$) in thickness, 2400 micro ohm centimeters ($\mu\Omega\cdot cm$) in DC specific resistance, 120 Oe in anisotropy field (Hk), and 9600 Gauss in saturation magnetization (Ms). It will be noted that film sample 2 is higher than film sample 1 in the specific resistance.

A percent ratio of the saturation magnetization of the film sample 2 and that of the metallic material M itself {Ms(M-X-Y)/Ms(M)}×100 was 44.5%.

Figure 5:
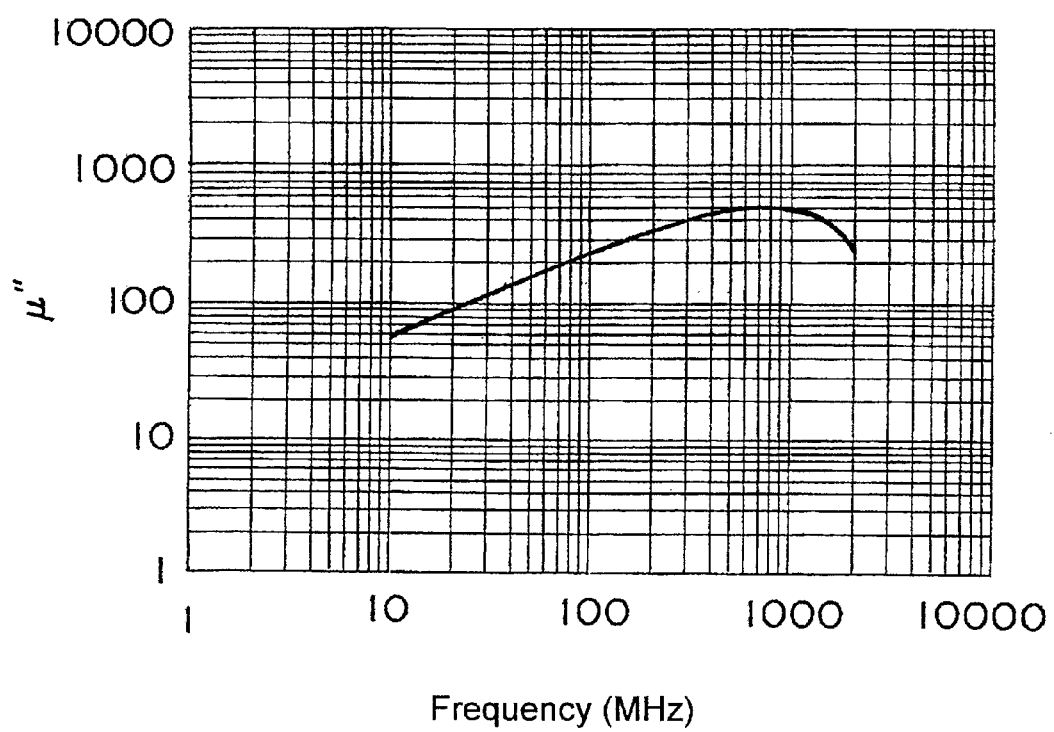
FIG. 5 is a graphical view showing a permeability frequency response of film sample 2 in Example 2.

The $\mu''$-f response of film sample 2 was also obtained in the similar manner as in Example 1 and shows in FIG. 5. It is noted that the peak has also a high value similar to that in film sample 1. However, the frequency point at the peak, or the natural resonance frequency is about 1 GHz and the imaginary part of relative permeability gradually falls either side of the peak so that the $\mu''$-f response has a broadband characteristic.

A relative bandwidth bwr of film sample 2 was also confirmed as 181% by the similar way as in Example 1.

COMPARATIVE EXAMPLE 1

In a condition similar to that in Example 1 but using of 90 Al₂O₃ chips, a comparative sample 1 was formed on a glass plate.

The comparative sample 1 produced was analyzed by a fluorescent X-ray spectroscopy and confirmed as a film of a composition $Fe_{86}Al_6O_8$. The comparative sample 1 had 1.2 micrometer ($\mu m$) in thickness, 74 micro ohm centimeters ($\mu\Omega\cdot cm$) in DC specific resistance, 22 Oe in anisotropy field (Hk), 18,800 Gauss in saturation magnetization (Ms), and 85.7% in a percent ratio of the saturation magnetization of the comparative sample 1 and that of the metallic material M itself {Ms(M-X-Y)/Ms(M)}×100, and was 44.5%.

Figure 6:
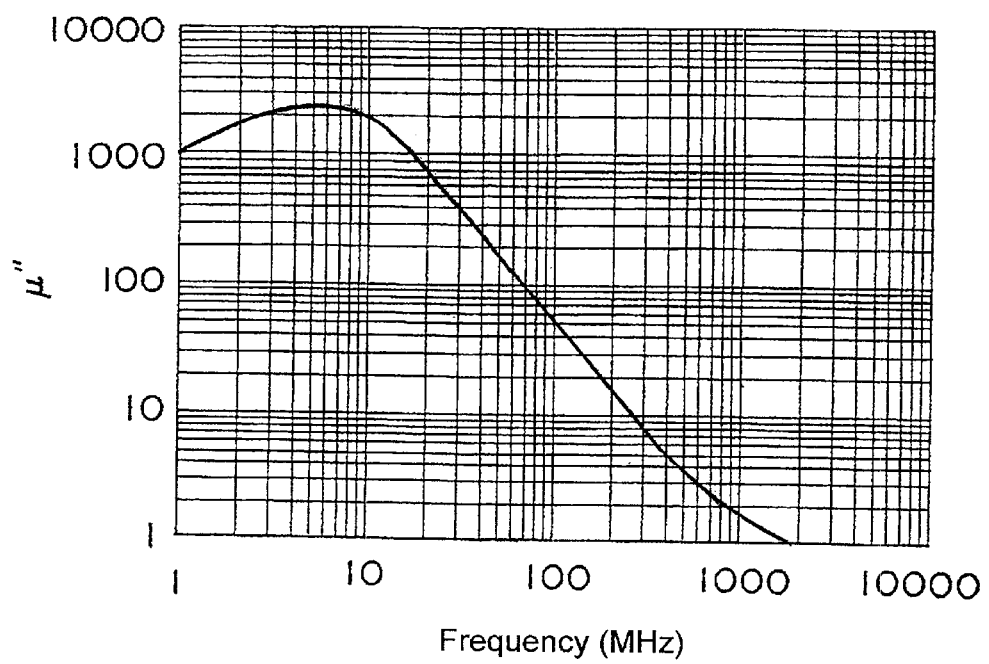
FIG. 6 is a graphical view showing a permeability frequency response of comparable sample 1 in Comparable Example 1.

The $\mu''$-f response of comparative sample 1 was also obtained in the similar manner as in Example 1, and is shown in FIG. 6. It will be noted from FIG. 6 that the imaginary part $\mu''$ of relative permeability of the comparative sample 1 has a high peak at a frequency about 10 MHz but rapidly reduces at the higher frequency range than 10 MHz. It can be supposed that this reduction is caused by generation of eddy current due to the lower specific resistance.

COMPARATIVE EXAMPLE 2

In a condition similar to that in Example 1 but using of 200 Al₂O₃ chips, a comparative sample 2 was formed on a glass plate.

The comparative sample 2 produced was analyzed by a fluorescent X-ray spectroscopy and confirmed as a film of a composition $Fe_{19}Al_{34}O_{47}$. The comparative sample 2 had 1.3 micrometer ($\mu m$) in thickness, 10,500 micro ohm centimeters ($\mu\Omega\cdot cm$) in DC specific resistance.

The magnetic characteristic of comparative sample 1 exhibited superparamagnetism.

EXAMPLE 4

A thin film of M-X-Y magnetic composition was made on a glass plate by the reactive sputtering method using the sputtering apparatus shown in FIG. 3A at a sputtering condition shown in Table 2. The partial pressure ratio of N₂ was 20%. The thin film was heat-treated at a temperature of 300° C. for two hours in vacuum under magnetic field and obtained a film sample 4.

TABLE 2

| | |
|---|---|
| Vacuum degree before sputtering | <1 × 10⁻⁶ Torr |
| Atmosphere | Ar + N₂ gas |
| Electric Power | RF |
| Targets | Fe (diameter of 100 mm) and Al chip (150 pieces) (chip size: 5 mm × 5 mm × 2 mm) |

The properties of film sample 4 are show in Table 3.

TABLE 3

| | |
|---|---|
| Film thickness | 1.5 $\mu m$ |
| {Ms(M-X-Y)/Ms(M)} × 100 | 51.9% |
| $\mu''_{max}$ | 520 |
| f($\mu''_{max}$) | 830 MHz |
| bwr | 175% |

EXAMPLE 5

A thin film of M-X-Y magnetic composition was made on a glass plate by using the sputtering apparatus shown in FIG.

3A at a sputtering condition shown in Table 4. The thin film was heat-treated at a temperature of 300° C. for two hours in vacuum under magnetic field and obtained a film sample 5.

TABLE 4

| | |
|---|---|
| Vacuum degree before sputtering | <1 × 10⁻⁶ Torr |
| Atmosphere | Ar gas |
| Electric Power | RF |
| Targets | Co (diameter of 100 mm) and Al$_2$O$_3$ chip (130 pieces) (chip size: 5 mm × 5 mm × 2 mm) |

The properties of film sample 5 are show in Table 5.

TABLE 5

| | |
|---|---|
| Film thickness | 1.1 μm |
| {Ms(M-X-Y)/Ms(M)} × 100 | 64.7% |
| $\mu''_{max}$ | 850 |
| f($\mu''_{max}$) | 800 MHz |
| bwr | 157% |

EXAMPLE 6

A thin film of M-X-Y magnetic composition was made on a glass plate by the reactive sputtering method using the sputtering apparatus shown in FIG. 3A at a sputtering condition shown in Table 6. The partial pressure ratio of N$_2$ was 10%. The thin film was heat-treated at a temperature of 300° C. for two hours in vacuum under magnetic field and obtained a film sample 6.

TABLE 6

| | |
|---|---|
| Vacuum degree before sputtering | <1 × 10⁻⁶ Torr |
| Atmosphere | Ar + N$_2$ gas |
| Electric Power | RF |
| Targets | Co (diameter of 100 mm) and Al chip (170 pieces) (chip size: 5 mm × 5 mm × 2 mm) |

The properties of film sample 6 are show in Table 7.

TABLE 7

| | |
|---|---|
| Film thickness | 1.2 μm |
| {Ms(M-X-Y)/Ms(M)} × 100 | 32.7% |
| $\mu''_{max}$ | 350 |
| f($\mu''_{max}$) | 1 GHz |
| bwr | 191% |

EXAMPLE 7

A thin film of M-X-Y magnetic composition was made on a glass plate by using the sputtering apparatus shown in FIG. 3A at a sputtering condition shown in Table 8. The thin film was heat-treated at a temperature of 300° C. for two hours in vacuum under magnetic field and obtained a film sample 7.

TABLE 8

| | |
|---|---|
| Vacuum degree before sputtering | <1 × 10⁻⁶ Torr |
| Atmosphere | Ar gas |
| Electric Power | RF |
| Targets | Ni (diameter of 100 mm) and Al$_2$O$_3$ chip (140 pieces) (chip size: 5 mm × 5 mm × 2 mm) |

The properties of film sample 4 are show in Table 9.

TABLE 9

| | |
|---|---|
| Film thickness | 1.7 μm |
| {Ms(M-X-Y)/Ms(M)} × 100 | 58.2% |
| $\mu''_{max}$ | 280 |
| f($\mu''_{max}$) | 240 MHz |
| bwr | 169% |

EXAMPLE 8

A thin film of M-X-Y magnetic composition was made on a glass plate by the reactive sputtering method using the sputtering apparatus shown in FIG. 3A at a sputtering condition shown in Table 10. The partial pressure ratio of N$_2$ was 10%. The thin film was heat-treated at a temperature of 300° C. for two hours in vacuum under magnetic field and obtained a film sample 8.

TABLE 10

| | |
|---|---|
| Vacuum degree before sputtering | <1 × 10⁻⁶ Torr |
| Atmosphere | Ar + N$_2$ gas |
| Electric Power | RF |
| Targets | Ni (diameter of 100 mm) and Al chip (100 pieces) (chip size: 5 mm × 5 mm × 2 mm) |

The properties of film sample 10 are show in Table 11.

TABLE 11

| | |
|---|---|
| Film thickness | 1.3 μm |
| {Ms(M-X-Y)/Ms(M)} × 100 | 76.2% |
| $\mu''_{max}$ | 410 |
| f($\mu''_{max}$) | 170 MHz |
| bwr | 158% |

EXAMPLE 9

A thin film of M-X-Y magnetic composition was made on a glass plate by using the sputtering apparatus shown in FIG. 3A at a sputtering condition shown in Table 12. The thin film was heat-treated at a temperature of 300° C. for two hours in vacuum under magnetic field and obtained a film sample 9.

TABLE 12

| | |
|---|---|
| Vacuum degree before sputtering | <1 × 10⁻⁶ Torr |
| Atmosphere | Ar gas |
| Electric Power | RF |
| Targets | Fe (diameter of 100 mm) and TiO$_2$ chip (150 pieces) (chip size: 5 mm × 5 mm × 2 mm) |

The properties of film sample 9 are show in Table 13.

TABLE 13

| | |
|---|---|
| Film thickness | 1.4 μm |
| {Ms(M-X-Y)/Ms(M)} × 100 | 43.6% |
| $\mu''_{max}$ | 920 |
| f($\mu''_{max}$) | 1.5 GHz |
| bwr | 188% |

EXAMPLE 10

A thin film of M-X-Y magnetic composition was made on a glass plate by the reactive sputtering method using the sputtering apparatus shown in FIG. 3A at a sputtering condition shown in Table 14. The partial pressure ratio of $O_2$ was 15%. The thin film was heat-treated at a temperature of 300° C. for two hours in vacuum under magnetic field and obtained a film sample 10.

TABLE 14

| Vacuum degree before sputtering | <1 × 10$^{-6}$ Torr |
|---|---|
| Atmosphere | Ar + $O_2$ gas |
| Electric Power | RF |
| Targets | Fe (diameter of 100 mm) and Si chip (130 pieces) (chip size: 5 mm × 5 mm × 2 mm) |

The properties of film sample 10 are show in Table 15.

TABLE 15

| Film thickness | 1.5 μm |
|---|---|
| {Ms(M-X-Y)/Ms(M)} × 100 | 55.2% |
| $\mu''_{max}$ | 920 |
| f($\mu''_{max}$) | 1.2 GHz |
| bwr | 182% |

EXAMPLE 11

A thin film of M-X-Y magnetic composition was made on a glass plate by using the sputtering apparatus shown in FIG. 3A at a sputtering condition shown in Table 16. The thin film was heat-treated at a temperature of 300° C. for two hours in vacuum under magnetic field and obtained a film sample 11.

TABLE 16

| Vacuum degree before sputtering | <1 × 10$^{-6}$ Torr |
|---|---|
| Atmosphere | Ar gas |
| Electric Power | RF |
| Targets | Fe (diameter of 100 mm) and HfO$_3$ chip (100 pieces) (chip size: 5 mm × 5 mm × 2 mm) |

The properties of film sample 11 are shown in Table 17.

TABLE 17

| Film thickness | 1.8 μm |
|---|---|
| {Ms(M-X-Y)/Ms(M)} × 100 | 77.4% |
| $\mu''_{max}$ | 1800 |
| f($\mu''_{max}$) | 450 MHz |
| bwr | 171% |

EXAMPLE 12

A thin film of M-X-Y magnetic composition was made on a glass plate by using the sputtering apparatus shown in FIG. 3A at a sputtering condition shown in Table 18. The thin film was heat-treated at a temperature of 300° C. for two hours in vacuum under magnetic field and obtained a film sample 12.

TABLE 18

| Vacuum degree before sputtering | <1 × 10$^{-6}$ Torr |
|---|---|
| Atmosphere | Ar gas |
| Electric Power | RF |
| Targets | Fe (diameter of 100 mm) and BN chip (130 pieces) (chip size: 5 mm × 5 mm × 2 mm) |

The properties of film sample 12 are shown in Table 19.

TABLE 19

| Film thickness | 1.9 μm |
|---|---|
| {Ms(M-X-Y)/Ms(M)} × 100 | 59.3% |
| $\mu''_{max}$ | 950 |
| f($\mu''_{max}$) | 680 MHz |
| bwr | 185% |

EXAMPLE 13

A thin film of M-X-Y magnetic composition was made on a glass plate by using the sputtering apparatus shown in FIG. 3A at a sputtering condition shown in Table 20. The thin film was heat-treated at a temperature of 300° C. for two hours in vacuum under magnetic field and obtained a film sample 13.

TABLE 20

| Vacuum degree before sputtering | <1 × 10$^{-6}$ Torr |
|---|---|
| Atmosphere | Ar gas |
| Electric Power | RF |
| Targets | Fe$_{50}$Co$_{50}$ (diameter of 100 mm) and Al$_2$O$_3$ chip (130 pieces) (chip size: 5 mm × 5 mm × 2 mm) |

The properties of film sample 13 are shown in Table 21.

TABLE 21

| Film thickness | 1.6 μm |
|---|---|
| {Ms(M-X-Y)/Ms(M)} × 100 | 59.3% |
| $\mu''_{max}$ | 720 |
| f($\mu''_{max}$) | 1.1 GHz |
| bwr | 180% |

EXAMPLE 14

A thin film of M-X-Y magnetic composition was made on a glass plate by using the vapor deposition apparatus shown in FIG. 3B at a condition shown in Table 22. The thin film was heat-treated at a temperature of 300° C. for two hours in vacuum under magnetic field and obtained a film sample 14.

TABLE 22

| Vacuum degree before sputtering | <1 × 10$^{-6}$ Torr |
|---|---|
| Atmosphere flowing rate | $O_2$ at 3.0 sccm |
| Elements in crucible 28 and 29 | Fe and Al |

The properties of film sample 14 are shown in Table 23.

TABLE 23

| Film thickness | 1.1 μm |
|---|---|
| {Ms(M-X-Y)/Ms(M)} × 100 | 41.8% |
| $\mu''_{max}$ | 590 |
| f($\mu''_{max}$) | 520 MHz |
| bwr | 190% |

Now, description will be made as to tests relating to noise suppressing effect of sample films and comparative samples, using a test apparatus shown in FIG. 7.

A test piece was film sample 1 with dimensions of 20 mm×20 mm×2.0 μm. For a comparison, a sheet of known composite magnetic material having dimensions of 20 mm×20 mm×1.0 mm. The composite magnetic material comprising polymer and flat magnetic metal powder dispersed in the polymer. The magnetic metal powder comprises Fe, Al and Si. The composite magnetic material has a permeability distribution in quasi-microwave range and has the maximum value of the imaginary part of relative permeability at a frequency about 700 MHz. Table 24 shows magnetic properties of both of the test piece and comparative test piece.

TABLE 24

|  | Film sample 1 | Comparative test piece |
| --- | --- | --- |
| $\mu''$/700 MHz | about 1800 | about 3.0 |
| bwr | 148 | 196 |

As seen from Table 24, the film sample 1 is about 600 times more than comparative test piece in the maximum value of imaginary part of relative permeability. Since the noise suppressing effect is generally evaluated from a value of a product ($\mu''_{max} \times \delta$) of the maximum value $\mu''_{max}$ of the imaginary part of relative permeability and thickness of the piece $\delta$, the thickness of the comparative test piece of the composite magnetic material sheet was selected 1 mm so that the both of test pieces have the similar values of ($\mu''_{max} \times \delta$).

Figure 7:
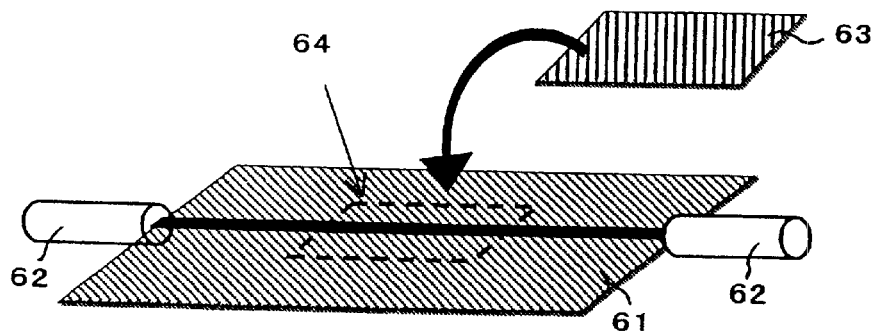
FIG. 7 is a schematic and perspective view of a test apparatus for testing an noise suppressing effect of magnetic samples.

Referring to FIG. 7, the test apparatus comprises a micro-strip line 61 having two ports, coaxial cables 62 connected to the two ports, and a network analyzer (not shown) connected across the two ports. The micro-strip line 61 has a line length of 75 mm and a characteristic impedance of 50 ohms. The test piece 63 was disposed at a region 64 on the micro-strip line 61 and the transmission characteristic S21 was measured. The frequency response of S21 are shown in FIGS. 8A and 8B for film sample 1 and the comparative sample, respectively.

Figure 8A:
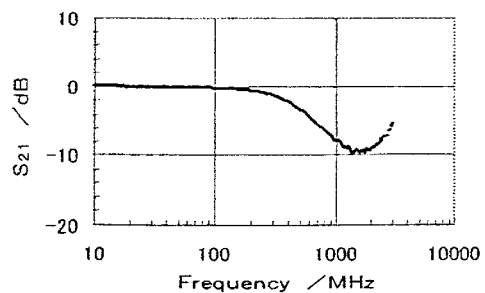
FIG. 8A is a graphic view showing a transmission characteristic of film sample 1.
Figure 8B:
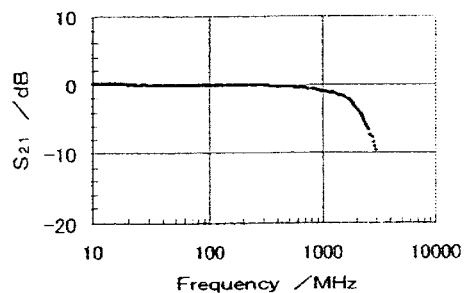
FIG. 8B is a graphic view showing a transmission characteristic of comparable sample of composite magnetic material sheet.

With respect to use of film sample 1, it will be noted from FIG. 8A that S21 reduces above 100 MHz, becomes to the minimum of −10 dB at a frequency of 2 GHz and then increases above 2 GHz. On the other hand, with respect to use of comparative sample, it will be noted from FIG. 8B that S21 gradually reduces and becomes to the minimum of −10 dB at a frequency of 3 GHz.

The results demonstrate that S21 is dependent on the frequency distribution of the permeability and that the noise suppressing effect is dependent on the product of ($\mu''_{max} \times \delta$).

Figures 9A, 9B, 9C:
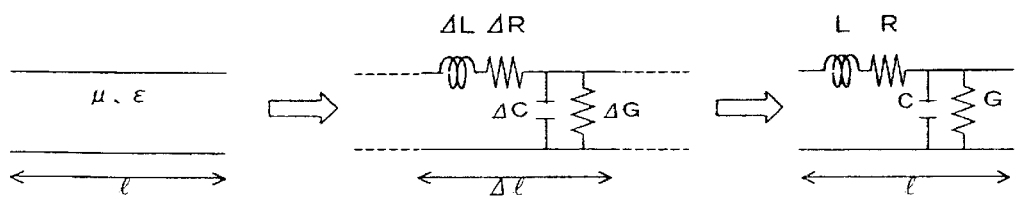
FIG. 9A is a distribution constant circuit with a length l showing a magnetic material as a noise suppressor.
FIG. 9B is an equivalent circuit with a unit length Δl of the distribution constant circuit of FIG. 9A.
FIG. 9C is an equivalent circuit with a length l of the distribution constant circuit of FIG. 9A.

Now, providing that the magnetic sample forms a distribution constant circuit having a length of l as shown in FIG. 9A, an equivalent circuit was calculated for a unit length of $\Delta l$ from transmission characteristics S11 and S21, as shown in FIG. 9B. Then, the equivalent circuit for the length l was obtained from the equivalent circuit for the unit length $\Delta l$, as shown in FIG. 9C. The equivalent circuit of the magnetic sample comprises series inductance L and resistance R and parallel capacitance C and conductance G, as shown in FIG. 9C. From this, it will be understood that the change of transmission characteristic of the micro-strip line caused due to disposition of the magnetic substance on the micro-strip line is mainly determined by the equivalent resistance R added in series.

Figure 10A:
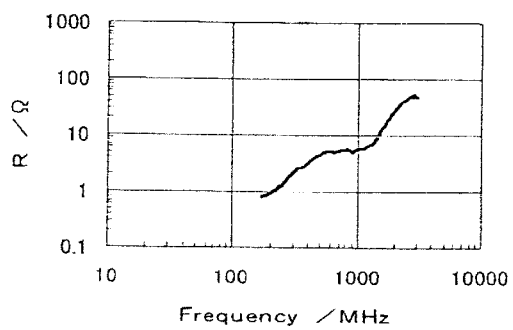
FIG. 10A is a graphic view showing a frequency response of an equivalent resistance R of film sample 1 in Example 1.
Figure 10B:
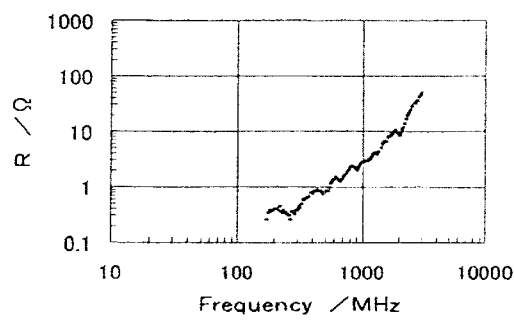
FIG. 10B is a graphic view showing a frequency response of an equivalent resistance R of comparative sample of a composite magnetic material sheet.

In view of the above, a frequency response of the equivalent resistance R was measured. The measured data were shown in FIGS. 10A and 10B for the film sample 1 and the comparative sample, respectively. It will be noted from these figures that the equivalent resistance R gradually reduces in the quasi-microwave range and is about 60 ohms at about 3 GHz. It is seen that the frequency dependency of the equivalent resistance R is different from that of the imaginary part of relative permeability which has the maximum value at about 1 GHz. It will be supposed that this difference will be based on the gradual increase of a ratio of the product and the sample length to the wavelength.

What is claimed is:

1. A resin-molded unit comprising:
   an electronic circuit component;
   a resin molding said electronic circuit component therein; and
   a high-frequency current suppressor covering at least one part of said resin, said high-frequency current suppressor being made of a magnetic loss film.

2. A resin-molded unit as claimed in claim 1, wherein said electronic circuit component is a semiconductor chip.

3. A resin-molded unit as claimed in claim 1, wherein said high-frequency current suppressor is a magnetic substance which shows large magnetic loss.

4. A resin-molded unit as claimed in claim 1, wherein said magnetic loss film is made of a granular magnetic material.

5. A resin-molded unit as claimed in claim 4, wherein said granular magnetic material is deposited on said at least one of said resin by sputtering.

6. A resin-molded unit as claimed in claim 4, wherein said granular magnetic material is a deposited on said at least one of said resin by vapor deposition.

7. A resin-molded unit comprising:
   an electronic circuit component;
   a resin molding said electronic circuit component therein; and
   a high-frequency current suppressor covering at least one part of said resin, said high-frequency current suppressor being made of a magnetic loss film which serves to attenuate a high-frequency current flowing through said electronic circuit component and having a frequency within a frequency band between several tens MHz and several GHz.

8. A resin-molded unit comprising:
   an electronic circuit component;
   a resin molding said electronic circuit component therein; and
   a high-frequency current suppressor covering at least one part of said resin, said high-frequency current suppressor being made of a magnetic loss film which is made of a magnetic substance of a magnetic composition comprising M, X and Y, where M is a metallic magnetic material consisting of Fe, Co, and/or Ni, X being element or elements other than M and Y, and Y being F, N, and/or O, said M-X-Y magnetic composition having a concentration of M in the composition so that said M-X-Y magnetic composition has a saturation magnetization of 35–80% of that of the metallic bulk of magnetic material comprising M alone, said magnetic composition having the maximum value $\mu''_{max}$ of an imaginary part $\mu''$ of relative permeability in a frequency range of 0.1–10 gigahertz (GHz).

9. A radiator as claimed in claim 8, which has a permeability frequency response of a relatively broad band where a relative bandwidth bwr is 150% or more, said relative bandwidth bwr is determined as a percentage ratio of bandwidth between two frequency points which shows the imaginary part of relative permeability as a half value $\mu''_{50}$ of the maximum value $\mu''_{max}$, to center frequency of said bandwidth.

* * * * *